US010024896B2

(12) United States Patent
Obata

(10) Patent No.: US 10,024,896 B2
(45) Date of Patent: Jul. 17, 2018

(54) INVERTER-DRIVEN ROTARY ELECTRIC MACHINE, PHASE-TO-PHASE INSULATION PARTIAL DISCHARGE INSPECTION METHOD AND PHASE-TO-PHASE INSULATION PARTIAL DISCHARGE INSPECTION APPARATUS

(75) Inventor: Koji Obata, Tokyo (JP)

(73) Assignee: HITACHI AUTOMOTIVE SYSTEMS, LTD., Hitachinaka-Shi (JP)

( * ) Notice: Subject to any disclaimer, the term of this patent is extended or adjusted under 35 U.S.C. 154(b) by 1149 days.

(21) Appl. No.: 14/112,828

(22) PCT Filed: Apr. 26, 2011

(86) PCT No.: PCT/JP2011/060167
§ 371 (c)(1),
(2), (4) Date: Dec. 6, 2013

(87) PCT Pub. No.: WO2012/147163
PCT Pub. Date: Nov. 1, 2012

(65) Prior Publication Data
US 2014/0180617 A1  Jun. 26, 2014

(51) Int. Cl.
*G01R 25/00* (2006.01)
*G01R 31/12* (2006.01)
(Continued)

(52) U.S. Cl.
CPC ......... *G01R 25/00* (2013.01); *G01R 31/1272* (2013.01); *G01R 31/346* (2013.01); *H02K 3/00* (2013.01); *G01R 31/343* (2013.01)

(58) Field of Classification Search
CPC .. G01R 25/00; G01R 31/1272; G01R 31/346; G01R 31/343; H02K 3/00
(Continued)

(56) References Cited

U.S. PATENT DOCUMENTS 7,112,940 B2 *  9/2006  Shimozono ............ H02K 11/00
                                                              318/400.19
8,816,694 B2 *  8/2014  Obata .................... G01R 31/06
                                                              324/536

FOREIGN PATENT DOCUMENTS

DE        10060243 A1   6/2002
JP        09-298853     11/1997
(Continued)

OTHER PUBLICATIONS

Written Opinion of the International Searching Authority for International Application PCT/JP2011/060167 dated Aug. 9, 2011.*
(Continued)

*Primary Examiner* — Michael Nghiem
*Assistant Examiner* — Peter Ngo
(74) *Attorney, Agent, or Firm* — Foley & Lardner LLP

(57) ABSTRACT

A phase-to-phase insulation partial discharge inspection apparatus includes: an impulse power supply (1) configured to apply an impulse voltage having a voltage rise time period tr which satisfies an expression "tr>$(\tau_{coil} \cdot V_{max})$/(PDIV)" to a rotary electric machine (2); a measurement section (12) configured to measure partial discharge which occurs when the impulse voltage is applied to the rotary electric machine (2); and a decision section (15) configured to determine that, when partial discharge is not measured by the measurement section (12), a phase-to-phase insulation performance is acceptable. In the expression, $\tau_{coil}$ is a surge propagation time period of one coil of a rotary electric machine winding, PDIV a partial discharge inception voltage between winding turns, and $V_{max}$ a peak of a partial discharge testing voltage for the phase-to-phase insulation.

6 Claims, 4 Drawing Sheets

(51) Int. Cl.
*G01R 31/34* (2006.01)
*H02K 31/00* (2006.01)
*H02K 3/00* (2006.01)

(58) Field of Classification Search
USPC ..................................... 702/72, 71; 310/179
See application file for complete search history.

(56) References Cited

FOREIGN PATENT DOCUMENTS

| JP | 2009-115505 A | 5/2009 |
|----|---------------|--------|
| JP | 2010-166813 A | 7/2010 |

OTHER PUBLICATIONS

Research Committee on Inverter Surge Insulation; English translation of "Impact of Inverter Surge on Insulation System"; IEEJ Technical Report 739, pp. I, 14-20; Aug. 1999.
IEC 60034-18-41 Ed. 1: Rotating electrical machines—Part 18-41: Qualification and quality control tests for partial discharge free (type 1) electrical insulation systems used in rotating electrical machines fed from voltage converters; pp. 1-44; Jun. 3, 2011; International Electrotechnical Commission; 2011.
PCT International Search Report on application PCT/JP2011/060167 dated Aug. 9, 2011; 1 page.
Partial English translation of German Patent and Trademark Office action issued in application 11 2011 105 190.5 dated Apr. 7, 2016.

\* cited by examiner

TESTING VOLTAGE Vmax NECESSARY CONDITION REGION
IN WHICH NO PD OCCURS BETWEEN TURNS

FIG.8
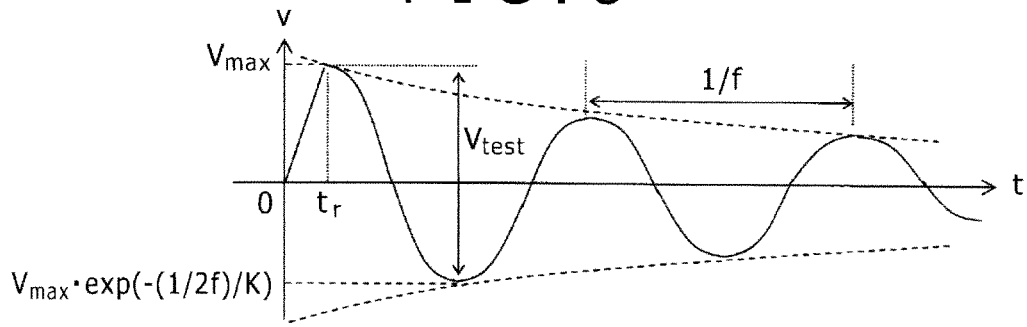
FIG.9
| | MEASUREMENT AMOUNT | WORKING EXAMPLE | CONVENTIONAL EXAMPLE |
|---|---|---|---|
| MOTOR PHASE-TO-PHASE IMPULSE PDIV | Up-p | 3.6kVp-p | 2.3kVp-p |
| | Uo-p | 2.0kVo-p | 1.3kVo-p |
| INSULATING MATERIAL PDIV (BIPOLAR IMPULSE) TURN-TO-TURN INSULATION | Uo-p | 0.65Vo-p | |
| PHASE-TO-PHASE INSULATION | Uo-p | 1.8kVo-p | |
| INSULATION TO EARTH | Uo-p | 1.6kVo-p | |
FIG.10
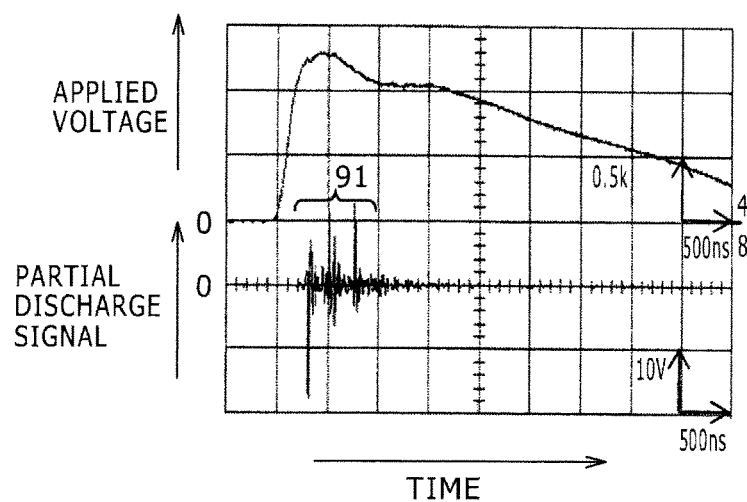

INVERTER-DRIVEN ROTARY ELECTRIC MACHINE, PHASE-TO-PHASE INSULATION PARTIAL DISCHARGE INSPECTION METHOD AND PHASE-TO-PHASE INSULATION PARTIAL DISCHARGE INSPECTION APPARATUS

TECHNICAL FIELD

The present invention relates to a rotary electric machine driven by an inverter (specifically an inverter-driven rotary electric machine having a rated voltage of 700 Vrms or less), and a phase-to-phase insulation partial discharge inspection method and a phase-to-phase insulation partial discharge inspection apparatus for the rotary electric machine.

BACKGROUND ART

In recent years, operating a rotary electric machine in variable speeds using an inverter is carried out actively from the view point of energy saving. However, it has been reported that, when a rotary electric machine is driven by an inverter, various problems arise at insulation parts of the rotary electric machine (Non-Patent Document 1). For example, it has been reported that, if a steep voltage (inverter surge voltage) generated when a switching element inside an inverter turns ON/OFF propagates along a cable and reaches a terminal of the rotary electric machine, then mismatching takes place in surge impedance between the cable and the rotary electric machine, as a result of which the voltage across the terminal of the rotary electric machine jumps to a magnitude of twice an output voltage of the inverter.

Further, it has been reported that, if a steep inverter surge voltage arrives at the inside of the rotary electric machine, then a high voltage is shared at a coil on the end leading side of a rotary electric machine winding or between winding turns in the coil. For the inverter-driven rotary electric machine, therefore, it is necessary to make the insulation design so as to withstand such inverter surge voltages and inspect the fabricated rotary electric machine to find whether or not it has a predetermined dielectric strength.

Incidentally, organic insulating materials are generally used in a low-voltage rotary electric machine having a voltage of 700 Vrms or less. Since such organic insulating materials are poor in resistance to partial discharge (PD), there is the possibility that, if the rotary electric machine is used in a condition under which partial discharge will occur, dielectric breakdown may occur in a comparatively short period of time. Therefore, such an insulation design as permits partial discharge not to occur during operation is conventionally adopted for low-voltage rotary electric machines having a voltage of 700 Vrms or less.

Specifically, the rotary electric machine is insulated in such designs that insulation parts between winding turns, between phases of the rotary electric machine and between the rotary electric machine and the ground have an increased insulation thickness so that partial discharge inception voltages (PDIV) across the insulation parts are higher than voltages applied to the insulation parts of the rotary electric machine upon operation to thereby prevent such partial discharge. Meanwhile, upon inspection of the rotary electric machine fabricated in this manner, a sine wave voltage or an impulse voltage is applied to the rotary electric machine to ensure that no partial discharge occurs at any of the insulation parts between the winding turns, between the phases and between the rotary electric machine and the ground. For example, Non-Patent Document 2 discloses such an insulation design and inspection method as just described. Further, Patent Document 1 discloses a partial discharge measurement method to be used in this instance, for example.

PRIOR ART DOCUMENTS

Patent Document

Patent Document 1: JP-2009-115505-A

Non-Patent Documents

Non-Patent Document 1: Technical Report of the Institute of Electrical Engineers of Japan, No. 739, p.12 to 20
Non-Patent Document 2: IEC60034-18-41

SUMMARY OF THE INVENTION

Problem to be Solved by the Invention

In recent years, together with speeding up of a switching element of an inverter, the rise time period tr of the inverter output voltage has been shortened. Therefore, the voltage shared between winding turns of an inverter-driven rotary electric machine has increased accordingly, resulting in the possibility that partial discharge may occur between the winding turns. Even in such a case, occurrence of partial discharge in the phase-to-phase insulation is not permitted. However, a method for appropriately inspecting partial discharge in the phase-to-phase insulation without being influenced by partial discharge between winding turns is not available.

Means for Solving the Problem

According to a first embodiment of the present invention, there is provided an inverter-driven rotary electric machine. In the machine, a surge propagation time period $\tau_{coil}$ of one coil and a partial discharge inception voltage PDIV between winding turns of a rotary electric machine winding are set such that partial discharge does not occur even if an impulse voltage having a voltage rise time period tr and a voltage peak $V_{max}$ which satisfy an expression (A1) given below is applied:

$$tr > (\tau_{coil} \cdot V_{max})/(\text{PDIV}) \quad (A1)$$

According to a second embodiment of the present invention, in the inverter-driven rotary electric machine according to the first embodiment, preferably the impulse voltage is an oscillation voltage having an oscillation frequency f, and the voltage rise time period tr is set so as to satisfy the following expression (A2):

$$tr \leq 1/(4f) \quad (A2)$$

According to a third embodiment of the present invention, in the inverter-driven rotary electric machine according to the second embodiment, preferably the impulse voltage is a damped oscillation voltage having the oscillation frequency f and a time constant K, and the oscillation frequency f is set so as to satisfy the following expression (A3):

$$-1/(2K \cdot ln((V_{test}/V_{max})-1)) \leq f \leq 1/(2\sqrt{(L \cdot C)}) \quad (A3)$$

According to a fourth embodiment of the present invention, in the inverter-driven rotary electric machine according to any one of the first to third embodiments, preferably a rated voltage is set to a value of 700 Vrms or less.

According to a fifth embodiment of the present invention, there is provided a phase-to-phase insulation partial discharge inspection method. The method includes: a step of applying an impulse voltage having a voltage rise time period tr which satisfies an expression (A1) given below to the rotary electric machine; a step of confirming whether or not partial discharge occurs; and a step of determining that, when occurrence of partial discharge is not confirmed, a phase-to-phase insulation performance of the rotary electric machine is acceptable.

$$tr > (\tau_{coil} \cdot V_{max})/(PDIV) \quad (A1)$$

In this expression, $\tau_{coil}$ is a surge propagation time period of one coil of a rotary electric machine winding, PDIV a partial discharge inception voltage between winding turns, and $V_{max}$ a peak of a partial discharge testing voltage for the phase-to-phase insulation.

According to a sixth embodiment of the present invention, in the phase-to-phase insulation partial discharge inspection method according to the fifth embodiment, preferably the impulse voltage is an oscillation voltage having an oscillation frequency f, and the voltage rise time period tr is set so as to satisfy the following expression (A2):

$$tr \leq 1/(4f) \quad (A2)$$

According to a seventh embodiment of the present invention, in the phase-to-phase insulation partial discharge inspection method according to the sixth embodiment, preferably the impulse voltage is a damped oscillation voltage having the oscillation frequency f and a time constant K, and the oscillation frequency f is set so as to satisfy the following expression (A3):

$$-1/(2K \cdot \ln((V_{test}/V_{max})-1)) \leq f \leq 1/(2\sqrt{(L \cdot C)}) \quad (A3)$$

According to an eighth embodiment of the present invention, there is provided a phase-to-phase insulation partial discharge inspection apparatus. The apparatus includes: an impulse power supply configured to apply an impulse voltage having a voltage rise time period tr which satisfies an expression (A1) given below to the rotary electric machine; a measurement section configured to measure partial discharge which occurs when the impulse voltage is applied to the rotary electric machine; and a decision section configured to determine that, when partial discharge is not measured by the measurement section, a phase-to-phase insulation performance is acceptable.

$$tr > (\tau_{coil} \cdot V_{max})/(PDIV) \quad (A1)$$

In the expression, $\tau_{coil}$ is a surge propagation time period of one coil of a rotary electric machine winding, PDIV a partial discharge inception voltage between winding turns, and $V_{max}$ a peak of a partial discharge testing voltage for the phase-to-phase insulation.

According to a ninth embodiment of the present invention, in the phase-to-phase insulation partial discharge inspection apparatus according to the eighth embodiment, preferably the impulse voltage is an oscillation voltage having an oscillation frequency f, and the voltage rise time period tr is set so as to satisfy the following expression (A2):

$$tr \leq 1/(4f) \quad (A2)$$

According to a tenth embodiment of the present invention, in the phase-to-phase insulation partial discharge inspection apparatus according to the ninth embodiment, preferably the impulse voltage is a damped oscillation voltage having the oscillation frequency f and a time constant K, and the oscillation frequency f is set so as to satisfy the following expression (A3):

$$-1/(2K \cdot \ln((V_{test}/V_{max})-1)) \leq f \leq 1/(2\sqrt{(L \cdot C)}) \quad (A3)$$

Effect Of The Invention

According to the present invention, an inverter-driven rotary electric machine which has an appropriate insulation performance and permits occurrence of partial discharge can be provided.

BRIEF DESCRIPTION OF THE DRAWINGS

FIG. 8 is a view illustrating a testing voltage waveform where an impulse voltage oscillates in damped oscillation.

FIG. 9 is a view illustrating a phase-to-phase insulation PDIV measurement value and a PDIV of a motor insulation material where an impulse voltage waveform of the present invention and a conventional impulse voltage waveform are used.

FIG. 10 is a view illustrating an example of partial discharge measurement when a conventional impulse voltage is applied to a rotary electric machine.

MODE FOR CARRYING OUT THE INVENTION

As described hereinabove, in recent years, together with speeding up of a switching element of an inverter, the rise time period tr of the inverter output voltage has been shortened. Therefore, the voltage shared between winding turns of an inverter-driven rotary electric machine has increased, resulting in the possibility that partial discharge may occur between the winding turns.

For such a problem as just described, a partial discharge-resistant enamel wire (generally called corona-resistant enamel wire, inverter surge-resistant wire or the like) which has a fixed resisting property to partial discharge and has a survival benefit of the insulation lifetime has been developed, and the likelihood that occurrence of partial discharge can be permitted has come out. Further, even where a partial discharge-resistant enamel wire is not used, in an automotive motor for use with an electric vehicle (EV), a hybrid vehicle (HEV) or the like driven only in a short period of time in comparison with conventional low-voltage motors for general industrial use, there is the possibility that occurrence of partial discharge may be permitted if a predetermined required lifetime is satisfied. In this manner, in recent years, the possibility that also a low-voltage rotary electric machine can be operated under conditions of occurrence of partial discharge has come out.

However, if occurrence of partial discharge is permitted once, then it becomes necessary to make, upon inspection, a distinction between partial discharge which occurs from an insulation part from which partial discharge may occur and partial discharge which occurs from an insulation part from which partial discharge must not occur. However, conventionally a product is inspected for insulation ensuring that partial discharge does not occur at any insulation locations including an insulation location between winding turns, an insulation location between phases and an insulation location from the ground. By the conventional method, therefore, an insulation inspection of a rotary electric machine which permits occurrence of partial discharge cannot be carried out.

Particularly, where a partial discharge inspection of phase-to-phase insulation of an inverter-driven rotary electric machine is carried out after neutral point connection, generally an impulse voltage having a high frequency is used. Thereupon, since the voltage is simultaneously applied also between winding turns, a problem arises that it cannot be distinguished whether partial discharge which occurs actually occurs between the winding turns between which occurrence of partial discharge can be permitted or occurs in phase-to-phase insulation in which partial discharge must not occur. As a result, a rotary electric machine having high insulation reliability cannot be provided.

Figure 1:
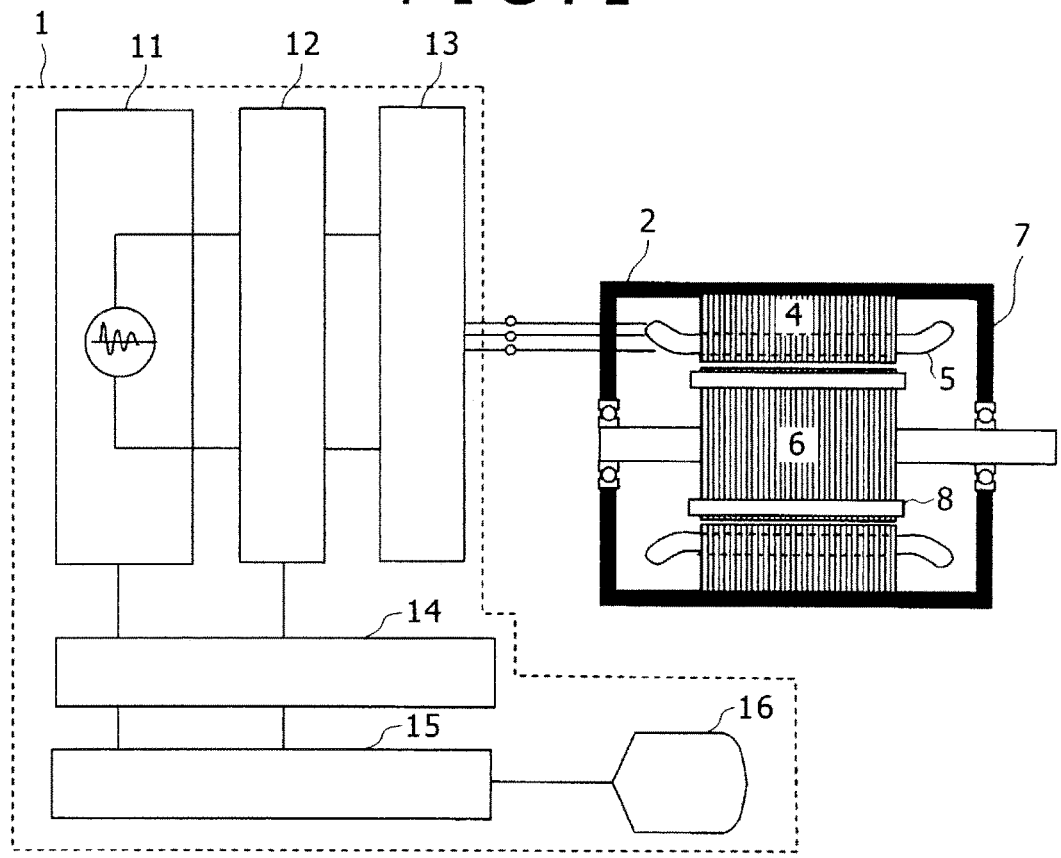
FIG. 1 is a view showing an insulation inspection apparatus 1.

In the following, a mode for carrying out the prevent invention is described with reference to the drawings. FIG. 1 is a view showing an example of an insulation inspection apparatus for inspecting a rotary electric machine by a phase-to-phase insulation partial discharge inspection method according to the present invention. The insulation inspection apparatus 1 includes an impulse power supply section 11, a partial discharge measuring instrument 12, a wiring changeover mechanism 13, a data collection storage section 14, an acceptance decision processing section 15 and a display section 16. Reference numeral 2 denotes a low-voltage rotary electric machine for being driven by an inverter which is a target of an inspection. In the following, the low-voltage rotary electric machine is referred to merely as motor.

The motor 2 includes a stator coil 5 which produces a rotating magnetic field, a stator 4 in which the stator coil 5 is accommodated, and a rotor 6 rotated by the rotating magnetic field. It is to be noted that, where the motor 2 is an induction motor, a secondary winding is inserted, but where the motor 2 is a permanent magnet synchronous motor, a magnet is inserted, at the position indicated by a reference numeral 8. The rotor 6 and the stator 4 of the motor 2 are accommodated in a frame 7. It is to be noted that, while the motor 2 in a state in which the rotor 6 is inserted therein is shown in FIG. 1, since the target of the inspection is the stator coil 5, the inspection can be carried out also in a state in which the rotor 6 is not inserted.

The impulse power supply 11 is connected to the wiring changeover mechanism 13 through the partial discharge measuring instrument 12. The motor 2 is connected to the wiring changeover mechanism 13. The wiring changeover mechanism 13 distributes an output line of the partial discharge measuring instrument 12 to three phases of U, V and W of the motor 2. In the data collection storage section 14, a magnitude of a testing voltage applied to the motor 2 by the impulse power supply 11 and a partial discharge pulse signal measured by the partial discharge measuring instrument 12 are recorded. It is to be noted that, for the measuring method of partial discharge, a well-known method disclosed, for example, in Non-Patent Document 1 or 2, JP-2007-232517-A or a like document is used. If no partial discharge pulse signal is generated at a prescribed testing voltage, then the acceptance decision processing section 15 determines that the motor 2 is acceptable, but if a partial discharge pulse signal is generated, then the acceptance decision processing section 15 determines that the motor 2 is unacceptable. The display section 16 is a liquid crystal display or a CRT and displays an acceptance decision result of the insulation inspection of the motor 2.

Figure 2:
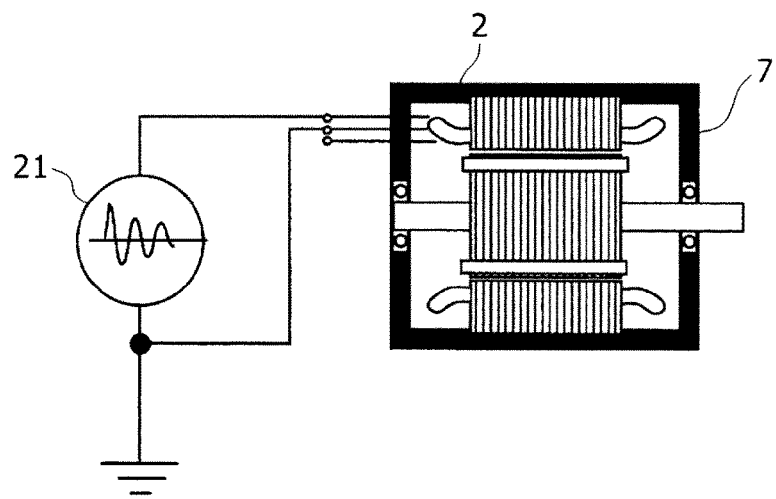
FIG. 2 is a view showing an example of an inspection circuit upon inspection of phase-to-phase insulation of a motor.

FIG. 2 shows an example of a testing circuit upon motor phase-to-phase insulation inspection. An impulse voltage 21 is applied between phases of an inspection target from among the three phases of U, V and W of the stator windings of the motor 2. Thereupon, the other phase and the motor frame 7 are placed in a floating potential state.

Figure 3:
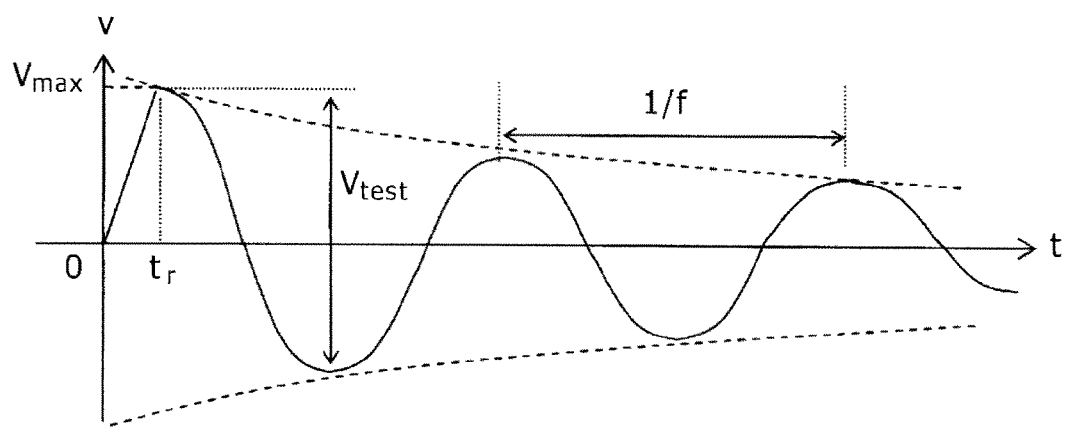
FIG. 3 is a view illustrating an applied voltage waveform upon inspection of phase-to-phase insulation.

FIG. 3 illustrates an impulse voltage waveform for use in the phase-to-phase insulation inspection of FIG. 1. In the present invention, an impulse voltage which first rises in a voltage rise time period tr and then exhibits damped oscillation as illustrated in FIG. 3 is used. As hereinafter described, by using such a voltage waveform as just described, the voltage to be applied between winding turns of the rotary electric machine can be suppressed. Further, generation of an abnormal voltage by generation of a standing wave having a high frequency inside the rotary electric machine winding can be suppressed.

Figure 4:
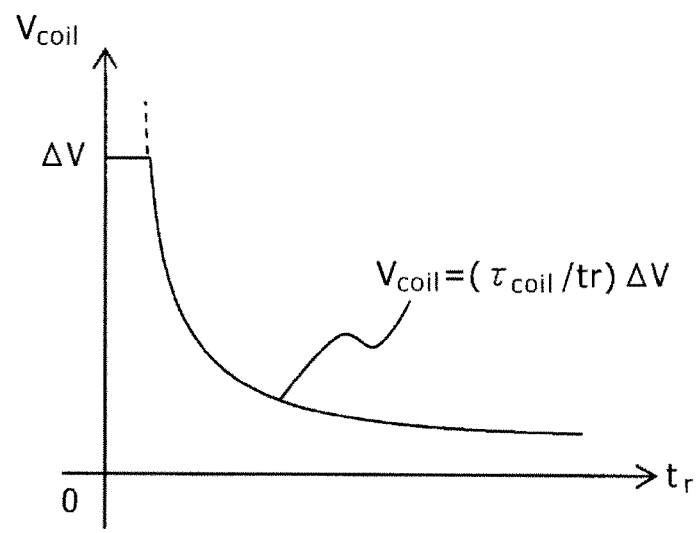
FIG. 4 is a view illustrating a variation of a winding turn-to-turn shared voltage $V_{coil}$ with respect to an impulse voltage rise time period tr.

FIG. 4 illustrates a winding turn-to-turn shared voltage Vcoil when the rise time period tr of the impulse voltage is varied. As a result of intensive studies of the voltage Vcoil generated between winding turns when an impulse voltage having a steep voltage rise time period is applied to the motor winding, it has become clear that the winding turn-to-turn shared voltage Vcoil can be represented by an expression "Vcoil=(τcoil/tr)ΔV" indicated in FIG. 4. Here, τcoil is a surge propagation time period of one coil of the motor winding, and tr and ΔV are a rise time period and a steep voltage variation amount of the impulse voltage, respectively. The steep voltage variation amount ΔV is a voltage variation amount within the rise time period tr.

Figure 5:
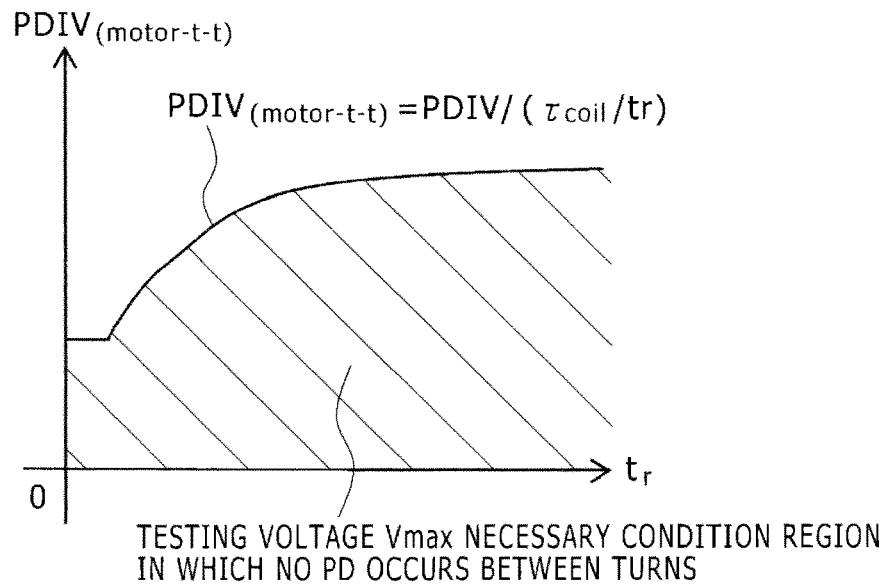
FIG. 5 is a view illustrating a testing voltage $V_{max}$ necessary condition in accordance with which partial discharge (PD) does not occur between winding turns.

Now, if the partial discharge inception voltage between winding turns is represented by PDIV and a condition for an impulse testing voltage which does not cause partial discharge (PD) between motor winding turns is determined using FIG. 4, then the condition is represented by a region indicated by slanting lines in FIG. 5.

Referring to FIG. 5, a curve representative of a boundary indicates a case wherein the winding turn-to-turn shared voltage $V_{coil}(=(\tau_{coil}/tr)\cdot \Delta V)$ and the partial discharge inception voltage PDIV are equal to each other. In the region indicated by the slanting lines, the winding turn-to-turn shared voltage $V_{coil}$ is lower than the partial discharge inception voltage PDIV, and occurrence of partial discharge between motor winding turns can be suppressed. In other words, if a voltage rise time period tr included in the slanting line region and an impulse voltage having a peak value $V_{max}$ are used, then occurrence of partial discharge between motor winding turns can be suppressed. Therefore, it is necessary for Tr and $V_{max}$ to satisfy the following expression (1):

$$V_{max} < PDIV(\text{motor-}t\text{-}t) = PDIV/(\tau_{coil}/tr) \quad (1)$$

Accordingly, upon inspection of a phase-to-phase insulation partial discharge, where the peak of the impulse voltage is represented by $V_{max}$, an impulse voltage having a voltage rise time period tr which satisfies an expression (2) given below is generated and applied to the motor. By this, a partial discharge test of the phase-to-phase insulation can be carried out while partial discharge which arises between winding turns is suppressed. Specifically, if the acceptance decision processing section 15 of FIG. 1 can confirm that, even if an impulse voltage of the voltage rise time period tr which satisfies the following expression (2) is applied, no partial discharge occurs, then it determines that the motor is acceptable in regard to the phase-to-phase insulation.

$$tr > (\tau_{coil} \cdot V_{max})/(PDIV) \quad (2)$$

Figure 6:
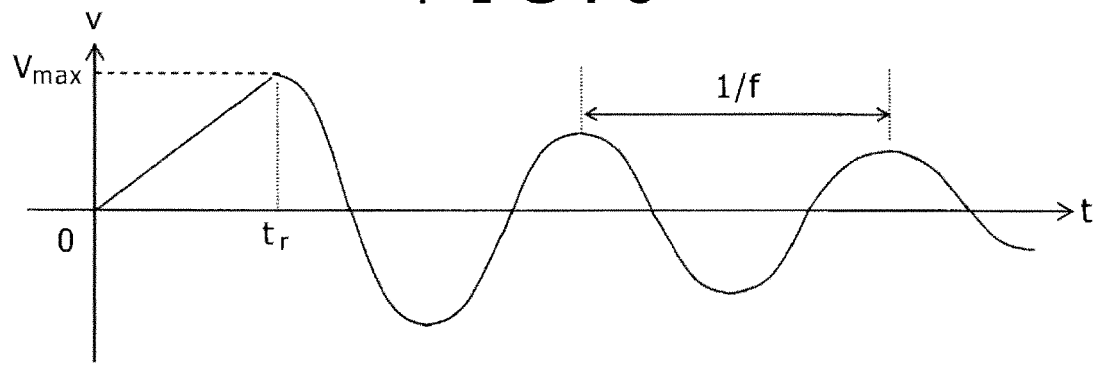
FIG. 6 is a view illustrating a case in which the voltage rise time period tr is at a low speed.

According to the expression (2), in order to carry out a partial discharge test of phase-to-phase insulation while partial discharge which occurs between winding turns is suppressed, the rise time period tr of the impulse voltage is to be made longer. An impulse test voltage waveform when the rise time period tr of the impulse voltage in FIG. 3 is made longer is illustrated in FIG. 6. However, if the rise time period tr of the impulse voltage is made longer as illustrated in FIG. 6, then impulse voltage oscillation by a step response does not occur any more. In other words, such a waveform as illustrated in FIG. 6 cannot really be produced. In this manner, the rise time period tr of the impulse voltage has an upper limit, and if the frequency of the impulse voltage oscillation wave is represented by f, then it is necessary for the rise time period tr to satisfy the following expression (3):

$$tr \leq 1/(4f) \quad (3)$$

Figure 7:
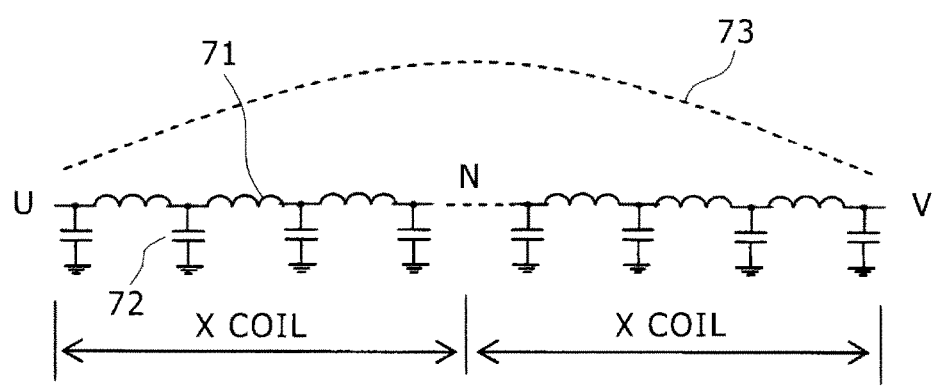
FIG. 7 is a view illustrating a generation condition of a standing wave inside a rotary electric machine winding.

FIG. 7 illustrates an occurrence example of a standing wave when a high frequency oscillation voltage is applied to the motor winding. Both of the U phase and the V phase are configured from X coils. For a high frequency oscillation voltage, the motor winding is represented by a distributed constant circuit in which inductances 71 of the coils and capacitances 72 between the coils and the core (ground) are connected to each other. As a result of intensive studies for creation of the present invention, it has become clear that, if a high frequency oscillation voltage is applied to such a distributed constant circuit as just described, then a standing wave is generated and an abnormal voltage sometimes appears inside the distributed constant circuit.

Usually, when a voltage is applied between the U and V phases, the voltage is distributed linearly from the leading side (high voltage side) of the U phase toward the V phase (low voltage side). However, if the frequency of the high frequency oscillation voltage is high, then an antinode of a standing wave appears in the proximity of a neutral point N of an intermediate portion between the U phase and the V phase as indicated by a broken line 73, and an abnormal voltage is generated.

However, in an actual inverter-driven state, no such voltage distribution appears inside the motor winding. If a partial discharge test of phase-to-phase insulation is carried out with a high frequency oscillation voltage of such a high frequency, therefore, then a wrong inspection result is obtained. Accordingly, it is necessary to use an impulse oscillation wave having a frequency with which no standing wave appears. A condition for preventing generation of a standing wave is, where the number of coils of one phase of the motor winding is represented by X, given by the following expression (4):

$$\lambda/2 > 2X \quad (4)$$

Further, where the inductance of one coil is represented by l and the capacitance is represented by c, since the velocity v of oscillation satisfies the following expression (5), such a condition as given by an expression (6) can be obtained with regard to the frequency f.

$$v = f \cdot \lambda = 1/\sqrt{l \cdot c} \quad (5)$$

$$f < 1/(4X\sqrt{l \cdot c}) \quad (6)$$

Here, where the overall inductance of the U-V winding is represented by L and the overall capacitance between the winding and the core is represented by C, since expressions (7) and (8) given below are satisfied, the expression (6) can be represented as an expression (9) given below. In other words, generation of a standing wave can be prevented if the expression (9) is satisfied. Accordingly, in the present embodiment, it has become clear that it is necessary for an impulse voltage oscillation wave to satisfy the expression (9).

$$L = 2X \cdot l \quad (7)$$

$$C = 2X \cdot c \quad (8)$$

$$f < 1/(2\sqrt{L \cdot C}) \quad (9)$$

FIG. 8 illustrates a testing voltage waveform where an impulse voltage oscillates in damped oscillation. Generally, although an impulse power supply can instantaneously generate energy, it cannot persistently generate an oscillation wave. In other words, unless energy continues to be supplied from the outside, the voltage peak value is attenuated as illustrated in FIG. 8. If the frequency f of damped oscillation is excessively low, therefore, then a problem that the peak voltage on the negative polarity side drops arises.

Where K is a decay time constant, the peak voltage on the negative polarity side is represented by an expression (10) given below, and therefore, the peak-to-peak voltage from the positive polarity side is such as given in the following expression (11):

$$V_{max} \cdot \exp(-(1/2f)/K) \quad (10)$$

$$V_{max}\{1 + \exp(-(1/2f)/K\} \quad (11)$$

Incidentally, since an AC voltage is applied to a phase-to-phase insulation part of a motor, upon inspection of phase-to-phase insulation, an AC voltage having a predetermined magnitude must be applied. Therefore, where the magnitude of the peak-to-peak voltage of the AC voltage is represented by $V_{test}$, the impulse voltage of FIG. 8 must satisfy an expression (12) given below. As a result, such a lower limit as represented by an expression (13) given below exists in the frequency f.

$$V_{max}\{1 + \exp(-(1/2f)/K)\} \geq V_{test} \quad (12)$$

$$-1/(2K \cdot \ln((V_{test}/V_{max}) - 1) \leq f \quad (13)$$

As described above, the condition for carrying out a phase-to-phase insulation inspection of an inverter-driven low-voltage rotary electric machine which permits occurrence of partial discharge between winding turns has been clarified. Measurement results when measurement of a partial discharge inception voltage (PDIV) of phase-to-phase insulation of a motor is carried out using an impulse voltage having a voltage waveform of the present embodiment and when such measurement is carried out using such a conventional steep impulse voltage as illustrated in FIG. 10 are illustrated in FIG. 9. Also PDIVs of insulating materials used for insulation between motor winding turns, between phases and between the motor and the ground are illustrated in FIG. 9.

In a working example of the present invention, the partial discharge inception voltage PDIV of phase-to-phase insulation is 3.6 kVp-p. This indicates that the value is equal to twice 1.8 kVo-p of the partial discharge inception voltage PDIV of the insulation material used for the phase-to-phase insulation and partial discharge of the phase-to-phase insulation of the motor has been measured correctly.

On the other hand, where a conventional impulse voltage is used, the partial discharge inception voltage PDIV of phase-to-phase insulation is 2.3 kVp-p and is measured a little lower than the original partial discharge inception voltage PDIV (1.8 kVo-p (3.6 kVp-p)) of the phase-to-phase insulation. The positive polarity peak voltage of the voltage of the conventional example is 1.3 kVo-p, and this is equal to twice the partial discharge inception voltage PDIV=0.65 kVo-p of turn-to-turn insulation. From this, it can be considered that, in the conventional example, there may be the possibility that partial discharge has occurred between winding turns when a partial discharge test of the phase-to-phase insulation is carried out. This is supported also from the following.

FIG. 10 illustrates an example of a voltage waveform and a partial discharge signal waveform when partial discharge of motor phase-to-phase insulation is measured using a conventional steep impulse voltage. In this instance, a partial discharge pulse signal 91 is generated only at a steep voltage rise portion. Further, since the polarity of the partial discharge pulse signal is reversed within a range of the steep voltage rise portion, the possibility that the shared voltage may rise suddenly as a result of the steep voltage variation and, thereafter, the winding turn-to-turn voltage which drops immediately may cause such a waveform as described above is suggested. In other words, there may be the possibility that partial discharge has occurred between winding turns.

As described above, by using the phase-to-phase insulation inspection method of the present embodiment, in an inverter-driven low-voltage rotary electric machine which permits occurrence of partial discharge between winding turns, a testing voltage can be applied to phase-to-phase insulation precisely without allowing partial discharge to occur between winding turns to inspect a partial discharge characteristic of the phase-to-phase insulation.

Further, when a rotary electric machine is designed, a surge propagation time period $\tau_{coil}$ of one coil of the rotary electric machine winding and a partial discharge inception voltage PDIV between winding turns are set such that, even when an impulse voltage having a voltage rise time period tr and a voltage peak $V_{max}$ which satisfy the expression "tr>$(\tau_{coil} \cdot V_{max})$/(PDIV)" is applied, no partial discharge may occur in the rotary electric machine. By such setting, an inverter-driven rotary electric machine which permits occurrence of partial discharge between winding turns, particularly a low-voltage rotary electric machine having a voltage of 700 Vrms or less, can be provided.

While various embodiments and modifications are described in the foregoing description, the embodiments may be used singly or in combination. This is because the effects by each of the embodiments can be achieved singly or synergistically. Further, as far as the characteristics of the present invention are not spoiled, the present invention is not restricted to the embodiments described hereinabove. Also other modes which are conceivable within the technical scope of the present invention are included in the scope of the present invention.

The invention claimed is:

1. A phase-to-phase insulation partial discharge inspection method for an inverter-driven rotary electric machine, comprising:
   a step of applying an impulse voltage having a voltage rise time period tr which satisfies an expression (A1) given below to the rotary electric machine;
   a step of confirming whether or not partial discharge occurs; and
   a step of determining that, when occurrence of partial discharge is confirmed, the partial discharge did not occur in winding insulation, and occurred in insulation of the rotary electric machine other than winding insulation, $$\text{tr} > (t_{coil} \cdot V_{max})/(\text{PDIV}) \tag{A1}$$

where $t_{coil}$ is a surge propagation time period of one coil of a rotary electric machine winding, PDIV a partial discharge inception voltage between winding turns, and $V_{max}$ a peak of a partial discharge testing voltage for the phase-to-phase insulation.

2. The phase-to-phase insulation partial discharge inspection method for an inverter-driven rotary electric machine according to claim 1, wherein
   the impulse voltage is an oscillation voltage having an oscillation frequency f, and
   the voltage rise time period tr is set so as to satisfy the following expression (A2):

$$\text{tr} \leq 1/(4f) \tag{A2}$$

3. The phase-to-phase insulation partial discharge inspection method for an inverter-driven rotary electric machine according to claim 2, wherein
   the impulse voltage is a damped oscillation voltage having the oscillation frequency f and a time constant K, and
   the oscillation frequency f is set so as to satisfy the following expression (A3):

$$-1/(2K \cdot \ln((V_{test}/V_{max})-1)) \leq f \leq 1/(2\sqrt{(L \cdot C)}) \tag{A3},$$

where $V_{test}$ is a peak-to-peak voltage of the damped oscillation voltage given by $V_{test}=V_{max}(1+\exp(-(1/2f)/k))$, L is an overall inductance of the winding turns, and C is an overall capacitance between the winding turns and a core or ground of the rotary electric machine.

4. A phase-to-phase insulation partial discharge inspection apparatus for an inverter-driven rotary electric machine, comprising:
   an impulse power supply configured to apply an impulse voltage having a voltage rise time period tr which satisfies an expression (A1) given below to the rotary electric machine;
   a measurement section configured to measure partial discharge which occurs when the impulse voltage is applied to the rotary electric machine; and
   a decision section configured to determine that, when occurrence of partial discharge is confirmed, the partial discharge did not occur in winding insulation, and occurred in insulation of the rotary electric machine other than winding insulation, $$\text{tr} > (t_{coil} \cdot V_{max})/(\text{PDIV}) \tag{A1}$$

where $t_{coil}$ is a surge propagation time period of one coil of a rotary electric machine winding, PDIV a partial discharge inception voltage between winding turns, and $V_{max}$ a peak of a partial discharge testing voltage for the phase-to-phase insulation.

5. The phase-to-phase insulation partial discharge inspection apparatus for an inverter-driven rotary electric machine according to claim 4, wherein
   the impulse voltage is an oscillation voltage having an oscillation frequency f, and
   the voltage rise time period tr is set so as to satisfy the following expression (A2):

$$\text{tr} \leq 1/(4f) \tag{A2}$$

6. The phase-to-phase insulation partial discharge inspection apparatus for an inverter-driven rotary electric machine according to claim 5, wherein the impulse voltage is a damped oscillation voltage having the oscillation frequency f and a time constant K, and the oscillation frequency f is set so as to satisfy the following expression (A3):

$$-1/(2K \cdot \ln((V_{test}/V_{max})-1) \leq f \leq 1/(2\sqrt{(L \cdot C)}) \quad (A3),$$

where $V_{test}$ is a peak-to-peak voltage of the damped oscillation voltage given by $V_{test}=V_{max}(1+\exp(-(1/2f)/k))$, L is an overall inductance of the winding turns, and C is an overall capacitance between the winding turns and a core or ground of the rotary electric machine.

* * * * *